United States Patent
Venkatasubramanian et al.

(10) Patent No.: US 7,838,760 B2
(45) Date of Patent: Nov. 23, 2010

(54) TRANS-THERMOELECTRIC DEVICE

(75) Inventors: Rama Venkatasubramanian, Cary, NC (US); Kip D. Coonley, Durham, NC (US); Edward P. Siivola, Raleigh, NC (US); Michael Puchan, Clayton, NC (US); Randall G. Alley, Raleigh, NC (US); Pratima Addepalli, Cary, NC (US); Brooks C. O'Quinn, Mamers, NC (US); Thomas Colpitts, Durham, NC (US); Mary Napier, Carroboro, NC (US)

(73) Assignee: Nextreme Thermal Solutions, Inc., Durham, NC (US)

( * ) Notice: Subject to any disclaimer, the term of this patent is extended or adjusted under 35 U.S.C. 154(b) by 1248 days.

(21) Appl. No.: 10/536,463

(22) PCT Filed: Nov. 25, 2003

(86) PCT No.: PCT/US03/37633

§ 371 (c)(1), (2), (4) Date: Mar. 13, 2006

(87) PCT Pub. No.: WO2004/049463

PCT Pub. Date: Jun. 10, 2004

(65) Prior Publication Data

US 2006/0225773 A1    Oct. 12, 2006

Related U.S. Application Data

(60) Provisional application No. 60/428,753, filed on Nov. 25, 2002.

(51) Int. Cl.
*H01L 35/30* (2006.01)
*F25B 21/02* (2006.01)

(52) U.S. Cl. .......................... 136/203; 136/205; 62/3.3; 62/3.2; 62/259.2; 165/104.33

(58) Field of Classification Search ................. 136/203, 136/205; 62/3.2, 3.3, 259.2; 165/104.33
See application file for complete search history.

(56) References Cited

U.S. PATENT DOCUMENTS 3,615,870 A    10/1971    Crouthamel (Continued)

FOREIGN PATENT DOCUMENTS

JP    63-253677    10/1988

(Continued)

OTHER PUBLICATIONS

PCT Search Report for PCT/US03/37633.

(Continued)

*Primary Examiner*—Alexa D Neckel
*Assistant Examiner*—Golam Mowla
(74) *Attorney, Agent, or Firm*—Myer Bigel Sibley & Sajovec, P.A.

(57) ABSTRACT

A thermoelectric device having at least one unipolar couple element (22) including two legs (22a) of a same electrical conductivity type. A first-temperature stage (24) is connected to one of the two legs. A second-temperature stage (28) is connected across the legs of the at least one unipolar couple element. A third-temperature stage (30) is connected to the other of the two legs. Methods for cooling an object and for thermoelectric power conversion utilize the at least one unipolar couple element to respectively cool an object and produce electrical power.

40 Claims, 5 Drawing Sheets

U.S. PATENT DOCUMENTS

| | | | |
|---|---|---|---|
| 5,228,923 | A | 7/1993 | Hed |
| 5,415,699 | A * | 5/1995 | Harman .................... 136/238 |
| 5,837,929 | A * | 11/1998 | Adelman ................... 136/225 |
| 5,950,067 | A | 9/1999 | Maegawa et al. |
| 6,100,463 | A * | 8/2000 | Ladd et al. ................. 136/201 |
| 6,162,985 | A | 12/2000 | Parise |
| 6,300,150 | B1 | 10/2001 | Venkatasubramanian |
| 6,800,933 | B1 | 10/2004 | Mathews et al. |
| 7,164,077 | B2 | 1/2007 | Venkatasubramanian |
| 7,235,735 | B2 | 6/2007 | Venkatasubramanian |
| 2002/0014261 | A1 * | 2/2002 | Caillat et al. ............... 136/205 |
| 2002/0046762 | A1 | 4/2002 | Rossi |
| 2002/0092557 | A1 * | 7/2002 | Ghoshal .................... 136/201 |
| 2003/0099279 | A1 * | 5/2003 | Venkatasubramanian et al. ....................... 374/179 |
| 2003/0131609 | A1 * | 7/2003 | Venkatasubramanian ...... 62/3.2 |
| 2003/0209014 | A1 | 11/2003 | Chang et al. |
| 2003/0230332 | A1 * | 12/2003 | Venkatasubramanian et al. ....................... 136/205 |
| 2006/0086118 | A1 | 4/2006 | Venkatasubramanian |
| 2006/0128059 | A1 | 6/2006 | Ahn et al. |
| 2006/0289050 | A1 | 12/2006 | Alley et al. |
| 2006/0289052 | A1 | 12/2006 | O'Quinn et al. |
| 2007/0028956 | A1 | 2/2007 | Venkatasubramanian |
| 2007/0089773 | A1 | 4/2007 | Koester et al. |
| 2007/0215194 | A1 | 9/2007 | Bharathan et al. |

FOREIGN PATENT DOCUMENTS

| | | |
|---|---|---|
| JP | 8-125237 | 5/1996 |
| JP | 10-70315 | 3/1998 |
| JP | 2002-111080 | 4/2002 |
| JP | 2002-111080 A | 4/2002 |
| JP | 02002111080 | 4/2002 |
| JP | 2002-232028 | 8/2002 |
| JP | 2002-232028 A | 8/2002 |
| JP | 02002232028 | 8/2002 |
| JP | 2002-537658 | 11/2002 |
| WO | WO 2004/049463 A1 | 6/2004 |
| WO | WO 2005/074463 A2 | 8/2005 |

OTHER PUBLICATIONS

Fontanazza "A Cooler Way to Stop Seizures" *Medical Device & Diagnostic Industry Magazine* pp. 1-2 (2005).

Ettenberg et al. "A New n-type and Improved p-type Pseudo-ternary ($Bi_2 Te_3$)($Sb_2 Se_3$) Alloy for Peltier Cooling" $15^{th}$ International Conference on Thermoelectrics, IEEE Catalog No. 96TH8169 pp. 52-56 (1996).

Kloeser "High-Performance flip chip packages with copper pillar bumping" *Global SMT & Packaging* pp. 28-31 (May 2006), www.globalsmt.net.

Press Release, Marlow Industries "New, Low-Profile Planar TEC Cools Detectors, Drives Cost Down" Apr. 29, 2008, Planar TEC, http://www.marlow.com/AboutMarlow/PressReleases/press_release_Apr_29_2008.htm.

Press Release, Marlow Industries "New, Low-Profile Planar TEC Cools Detectors, Drives Cost Down" Apr. 29, 2008, ThomasNet Industrial Newsroom, http://news.thomasnet.com/printreadycn.html?prid=816927.

Rothman "Pathophysiology and therapy of epilepsy" Website of Professor Steven Rothman, M.D. of Washington University in St. Louis: http://neuroscience.wustl.edu/research/faculty.php?id=81.

Snyder et al. "Hot Spot Cooling Using Embedded Thermoelectric Coolers" 22nd IEEE SEMI-THERM Symposium, IEEE Catalog No. 1-4244-0154-2 pp. 135-143 (2006).

Venkatasubramanian et al. "Phonon-Blocking Electron-Transmitting Structures" $18^{th}$ International Conference on Thermoelectrics (1999), pp. 100-103.

Japanese Office Action (5 pages) corresponding to Japanese Patent Application No. 2004-555717; Mailing Date: Sep. 22, 2010.

* cited by examiner

| Tsource(C) | Tsink(C) | I(Amp) | ΔT |
|---|---|---|---|
| 22.1 | 22 | 0 | 0.1 |
| 20 | 22 | 0.2 | 2 |
| 16.9 | 22 | 0.5 | 5.1 |
| 12.3 | 22 | 1 | 9.7 |
| 3.9 | 22 | 2 | 18.1 |

| Tsource(C) | Tdrain(C) | I(Amp) | ΔT |
|---|---|---|---|
| 22.4 | 22.3 | 0 | 0.1 |
| 19.8 | 25.1 | 0.2 | 5.3 |
| 16.1 | 29.9 | 0.5 | 13.8 |
| 13.9 | 33.3 | 0.7 | 19.4 |
| 10.8 | 38.9 | 1 | 28.1 |
| 8.9 | 42.9 | 1.2 | 34 |
| 6.2 | 49.6 | 1.5 | 43.4 |
| 4.6 | 54.4 | 1.7 | 49.8 |
| 2.5 | 61.9 | 2 | 59.4 |

TRANS-THERMOELECTRIC DEVICE

RELATED APPLICATIONS

The present application is a 35 U.S.C. §371 national phase application of PCT International Application No. PCT/US2003/037633, having an international filing date of Nov. 25, 2003 and claiming priority to United States Provisional Application No. 60/428,753 filed Nov. 25, 2002, the disclosures of which are incorporated herein by reference in their entireties. The above PCT International Application was published in the English language and has International Publication No. WO 2004/049463 A1.

STATEMENT OF GOVERNMENT RIGHTS

The U.S. Government has a paid-up license in this invention and the right in limited circumstances to require the patent owner to license others on reasonable terms as provided for by the terms of Navy Contract No. N00014-04-C-0042 awarded by the Office of Naval Research.

FIELD OF THE INVENTION

This invention relates to the field of thermoelectric devices and methods of manufacturing such devices.

BACKGROUND OF THE INVENTION

A thermoelectric device is capable of generating electricity if two ends of the thermoelectric device are held at different temperatures. When two dissimilar metals (conductors) or semiconductors having different Seebeck potential or Fermi energy levels are in contact at each end, a voltage is obtained if the ends are at different temperatures (i.e., the Seebeck effect). Conversely, an applied electrical current can induce a temperature differential between the two ends due to the Peltier effect. The Peltier effect causes absorption or liberation of heat when current flows across the junction of two dissimilar materials. As electrons flow from a p-type semiconductor to an n-type semiconductor an energy gap or "hurdle" is traversed. Thermal energy is absorbed as electrons overcome this energy hurdle, and this junction is cooled. Conversely, as electrons flow from an n-type semiconductor to a p-type semiconductor, electrons "fall" down the energy gap and thus release heat. This release will locally heat the junction.

Thus, a thermoelectric device can be a cooler or a heat pump which transfers heat by electric current. The principles of thermoelectricity are utilized in power generation, thermocouples, and refrigeration. The efficiency of a thermoelectric device can be expressed in terms of a figure of merit (ZT). In order for a material to be efficient for thermoelectric power conversion, it is important to allow charge carriers to diffuse easily across multiple Peltier couples while maintaining a temperature gradient. That is, there must be a relatively high value for the Seebeck coefficient (S), a high electrical conductivity (a), and a low thermal conductivity (K). Current designs of commercially available thermoelectric devices have efficiencies too low to warrant widespread cooling application. However, improvements in the thermoelectric material properties and thermoelectric device design are expected to provide thermoelectric devices with enhanced thermal performance. These devices will be better suited for power generation, cooling, and temperature control applications.

Typically, a thermoelectric device contains p-type and n-type semiconducting materials sandwiched between two ceramic plates, for example an upper and lower faceplate or carrier plate. The faceplates typically have high electrical resistivity and low thermal conductivity. Situated between the faceplates are a number of Peltier couples, formed by joining p-type and n-type semiconductor elements. These couples can be arranged in a two-dimensional array, thermally in parallel, and connected by conductors (braze, solder, and the like) so as to be electrically in series. Typically, a device being cooled is placed in thermal contact with the cold faceplate, and a heat sink is placed in contact with the hot faceplate.

Accordingly, a thermoelectric device technology typically uses a bipolar, p-n couple with two temperature zones as shown in FIG. 1. FIG. 1 depicts a conventional bipolar p-n couple 10 having two legs 10$a$ and 10$b$ of opposite conductivity type. As shown, the bipolar p-n couple 10 is configured with a polarity for cooling at heat source 12. The legs 10$a$ and 10$b$ are connected electrically in series and thermally in parallel such that current flow serially through the legs 10$a$ and 10$b$ carries heat to heat sink 14 where the heat is dissipated from the thermoelectric device. Consequently, the bipolar p-n couple 10 utilizes two temperature zones connected respectively to the heat source 12 and the heat sink 14. Fins 16, as shown, are frequently utilized on either the heat source 12 or the heat sink 16, if needed.

However, the utilization of different n and p-type materials adds complications to the manufacturing process and frequently costs efficiency of the fabricated thermoelectric device, as the thermoelectric performance of one of the n and p-type materials is typically lower the thermoelectric performance of the other of the opposite type.

SUMMARY OF THE INVENTION

One object of the present invention is to provide unipolar p-p or n-n couple avoiding the use of a complementary n-type and p-type thermoelectric pair.

Another object of the present invention is to provide a unipolar p-p or n-n couple with two electrical terminals and three temperature terminals. As such, the present invention is a departure from conventional thermoelectric device fabrication utilizing a bipolar p-n couple with two electrical terminals and two temperature zones.

A further object of the present invention is to provide a device fabrication process which reduced the complexity of assembly of modules.

Still, a further object of the present invention is to provide higher efficiency thermoelectric devices by utilizing in the thermoelectric devices the specific n- or p-type thermoelectric material that has the better thermoelectric material properties.

Thus, according to one aspect of the present invention, there is provided a novel a thermoelectric device including at least one unipolar couple element having two legs of a same electrical conductivity type, a first-temperature stage connected to one of the two legs, a second-temperature stage connected across the legs of the at least one unipolar couple element, and a third-temperature stage connected to the other of the two legs.

According to another aspect of the present invention, there is provided a method for cooling an object. The method conducts heat from an object coupled to the above-noted thermoelectric device, flows currents in opposite directions in the two legs of the thermoelectric device to transport the heat across each of the legs in a direction away from the object, and disposes of the heat into an ambient environment.

In still another aspect of the present invention, there is provided a method for thermoelectric power conversion that extracts heat from a heat source coupled to the above-noted thermoelectric device, maintains a temperature differential across the thermoelectric device to a heat sink, and dissipates heat from the heat sink into an ambient environment. Maintaining the temperature differential across the two legs generates electrical power from thermoelectric device.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
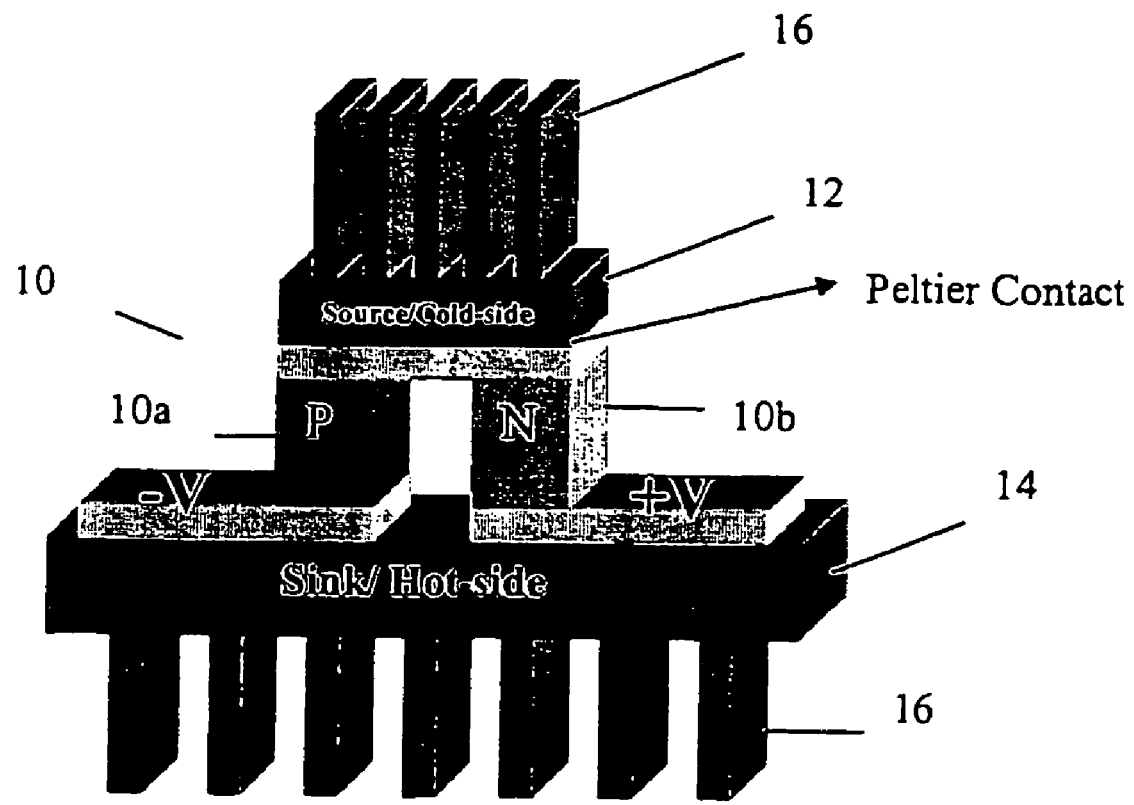
FIG. 1 is a schematic illustration of a conventional p-n couple having a configuration with a polarity for cooling a heat source.
Figure 2:
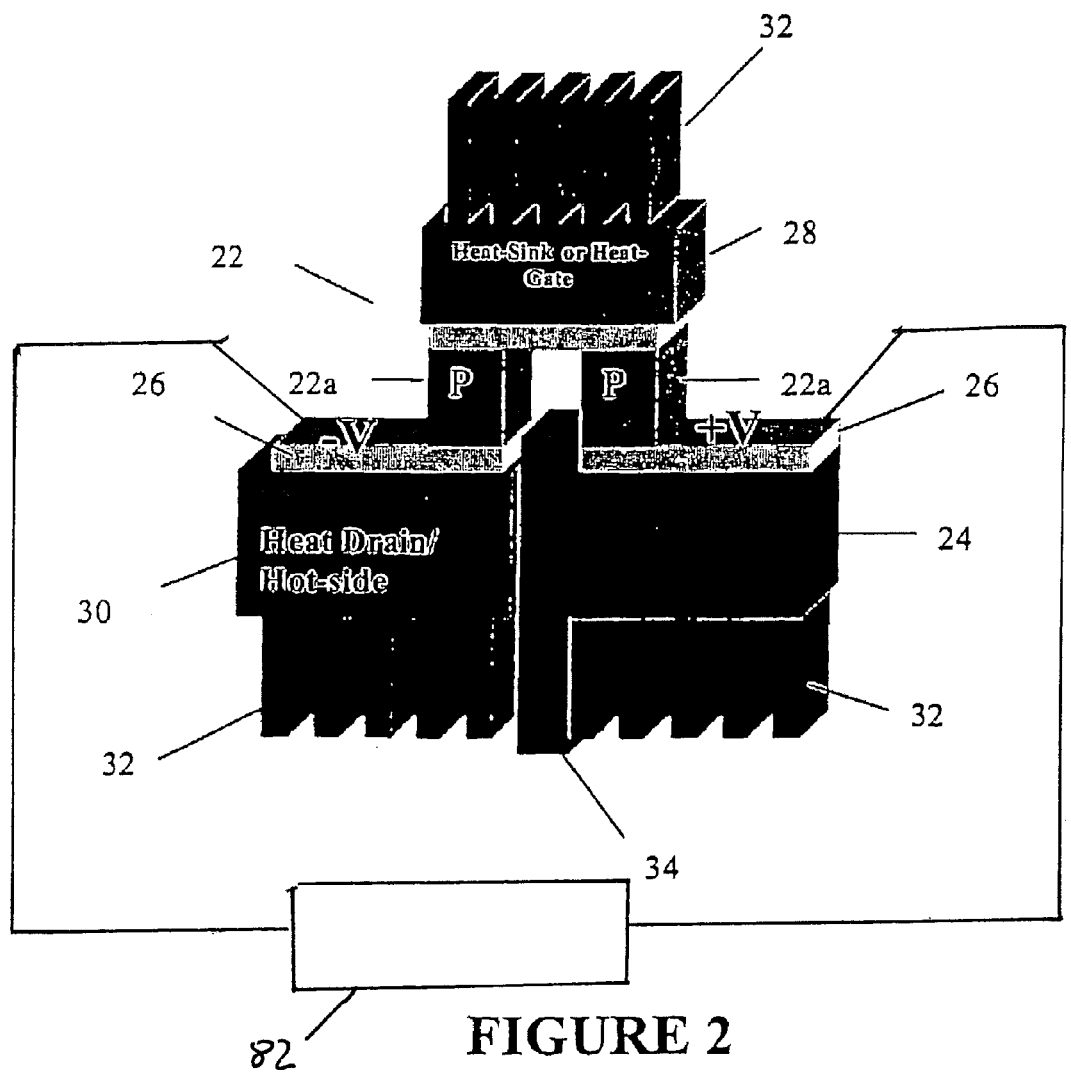
FIG. 2 is a schematic illustration according to one embodiment the present invention of a three-thermal-terminal ($T^3$) p-p couple having a configuration with a polarity for cooling a heat source.

Referring now to the drawings, wherein like reference numerals designate identical, or corresponding parts throughout the several views, and more particularly to FIG. 2, FIG. 2 depicts a trans-thermoelectric device 20 of the present invention. The trans-thermoelectric device 20 includes a three-thermal-terminal ($T^3$) p-p couple element 22 shown in FIG. 2 as having a configuration for cooling a heat source 24. The trans-thermoelectric device 20, while shown having a p-p couple, could instead be an n-n couple element. In either case, the unipolar couple element 22 has two legs 22a of a same electrical conductivity type. As shown in FIG. 2, electrical terminals 26 connected to respective ends of the two legs 22a on one side of the unipolar couple element 22. The heat source 24 constitutes a first-temperature stage connected to one of the legs 22a. A heat sink/gate 28 constitutes a second-temperature stage and is connected to a side of the unipolar couple element 22 opposite the electrical terminals 26. A heat drain 30 constitutes a third-temperature stage and is connected to the other leg of the unipolar couple opposite the heat source 24, as shown illustratively in FIG. 2. A configuration for power conversion would be similar to that shown in FIG. 2, except that there would be maintained a temperature differential between the heat source 24 and the heat drain 30, thereby inducing an electropotential on the electrical terminals 26 and current flow through the unipolar couple element 22.

The trans-thermoelectric device 20 in this embodiment employs a unipolar p-p or n-n couple having two electrical terminals and three temperature terminals, thereby achieving a large temperature differential across each end of the unipolar couple element 22. The trans-thermoelectric device 20 can be considered as a three temperature zone device, and represents a significant departure from a conventional bipolar p-n couple having two electrical terminals and two temperature zones. The term "Trans" is used herein to denote the effect of a "transfer thermal effect" similar to the "transconductance" in a three-terminal electrical transistor device. In this analogy, the present invention represents a transition in thermoelectric device technology much alike the transition in electronic device technology from a two-terminal diode to a three-terminal transistor. By the analogy, the present invention can be considered a transition from a conventional p-n thermocouple (i.e. a thermal diode) having two end temperatures, the source temperature and the sink temperature, to a thermal triode having three end temperatures (i.e., a source temperature, an intermediate-sink temperature, and a drain temperature).

The above three-thermal-terminal p-p couple of the present invention, as compared to a conventional two-terminal p-n couple, utilizes two-stage pumping first from the heat source 24 to the heat sink/gate 28, and then to the heat drain 30. By using this approach, the present invention takes advantage of the higher coefficient of performance (COP) of a p-type leg as compared to a n-type leg, when operating as a heat pump, pumping heat from the heat source 24 to the heat sink/gate 28, and then to the heat drain 30. The heat sink/gate 28 is maintained at a desired temperature, somewhere between that of the heat source 24 and the heat drain 30. Thus, the heat sink/gate 28 can be considered a gate whose temperature, by adjustment (similar to the base of a bipolar transistor or a gate of field-effect transistor), varies the performance of the trans-thermoelectric device 20. So the present invention can also be used in "an all thermal-logic" devices or their applications. The fact that there is a trans-thermal effect or a gate-control-like effect means that the temperature of the gate 28 can be an equivalent thermal input for a thermal-logic function and the temperatures at the source 24 and drain 30 can be the output of the thermal-logic function.

Part of the role of the heat sink/gate 28 is to dissipate from the trans-thermoelectric device 20 a fraction of the waste-heat from heat source side. Thereby, one leg of the trans-thermoelectric device 20 on the heat drain side does not have to pump this fraction of waste-heat to the heat drain 30. The heat sink/gate 28 provides a thermal path, but does not provide an electrical path for current flow. Rather, current flows from the heat source side p-leg to the heat drain side p-leg. As such, the trans-thermoelectric device 20 uses both active cooling and heating within the two legs 22a of the unipolar couple element 22, simultaneously, to achieve a large ΔTmax in a single-stage couple, thus expanding the use of thermoelectric device technology and improving performance. Controller 82 may be configured to control a temperature of heat sink/gate 28 (e.g., a second-temperature stage) to produce desired source and drain temperatures on heat source 24 (e.g., a first-temperature stage) and heat drain 30 (e.g., a third-temperature stage), respectively. Controller 82 may be configured to control current flow through unipolar couple element 22 to produce desired source and drain temperatures.

Fins 32, while shown in FIG. 2 at each of these temperature zones, are optional. Thermal insulation 34, while shown in FIG. 2 between the heat source 24 element and the heat drain 30, is also optional. The thermal insulation 34 could be formed by a vacuum between the heat source/cold-side element and the heat drain/hot-side element if feasible, or could be formed with a low-thermal-conductivity medium (e.g., an aerogel having a thermal conductivity of ~0.02 to 0.05 W/m-K). Regardless, the thermal insulation 34 serves to reduce the thermal transfer between the heat drain and the heat source.

The trans-thermoelectric devices of the present invention preferably utilize whichever one of p-type or n-type thermoelements that has a higher figure-of-merit (ZT). For example, thermoelectric devices and modules can be constructed using only p-type $Bi_2Te_3/Sb_2Te_3$ superlattice thermoelements with a ZT of ~2.5 at 300K, rather than combining with the p-type thermoelements n-type $Bi_2Te_3$-based superlattice thermoelements with a ZT of ~1.2 to 1.9 at 300K to form a conventional p-n couple. Similarly, the present invention can use only n-type PbTeSe/PbTe quantum-dot superlattice thermoelements with a ZT of ~1.6 at 300K, rather than combining with n-type thermoelements p-type PbTe-based superlattice thermoelements with a much lower ZT at 300K. Similarly, unipolar couple elements can be made of only bulk p-type $Bi_xSb_{2-x}Te_3$ or n-type $Bi_2Te_{3-x}Se_x$. Indeed, the present invention opens up thermoelectric device technology to thermoelectric material systems where only one polarity (p-type or n-type) of material is good for obtaining higher ZT in the temperature range of interest.

The two adjacent legs of the unipolar couple element 22, of same polarity or conductivity type, need not be the same material. For example, one p-type leg can be $Bi_{1.0}Sb_{1.0}Te_3$ and an adjacent p-leg can be $Bi_{0.5}Sb_{1.5}Te_3$. Each of these materials can be chosen based on the optimum property for that temperature stage. Similarly, one p-type leg can be a 10 Angstrom/30 Angstrom $Bi_2Te_3/Sb_2Te_3$ superlattice and the adjacent p-leg can be 10 Angstrom/50 Angstrom $Bi_2Te_3/Sb_2Te_3$ superlattice. Likewise, one n-type leg can be an n-type $Bi_2Te_{2.5}Se_{0.5}$ thermoelement, and an adjacent leg can be an n-type $Bi_2Te_{2.85}Se_{0.15}$ thermoelement. Similarly, one n-type leg can be an n-type 10 Angstrom/30 Angstrom $Bi_2Te_3/Bi_2Te_{2.85}Se_{0.15}$ superlattice thermoelement, and an adjacent leg can be an n-type 10 Angstrom/50 Angstrom $Bi_2Te_3/Bi_2Te_{2.85}Se_{0.15}$ superlattice thermoelement.

The use of unipolar trans-thermoelectric devices reduces the complexity of assembly of modules, and reduces the need for perfect matching of the thermal performance of the p-type and n-type legs in the conventional bipolar couple. The use of unipolar p-p or n-n transthermistor devices reduces the need for perfect matching of the p and n legs. In a conventional p-n bipolar thermoelectric device, the properties of the p- and n-legs have to be well known to optimize the geometric properties or the aspect ratio of the two legs. However, with the use of p-p or n-n unipolar couples in the present invention, the matching is guaranteed by using the same material for both the legs. The use of unipolar trans-thermoelectric devices reduces the ΔT per element (i.e. across one p-element of a p-p couple) by about half, compared to that which would exist in each element of a conventional p-n couple for the same cold and hot-end temperatures. As such, thermal stress is reduced in the trans-thermoelectric devices as compared to the conventional two-terminal device for a fixed ΔT between the hot and cold-side temperatures. Alternatively, the use of unipolar trans-thermoelectric device can increase the ΔTmax achievable per couple significantly, over and above the conventional p-n couple, thereby providing a higher coefficient of performance (COP) for a fixed ΔT between the hot and cold-side temperatures.

Figures 3A, 3B:
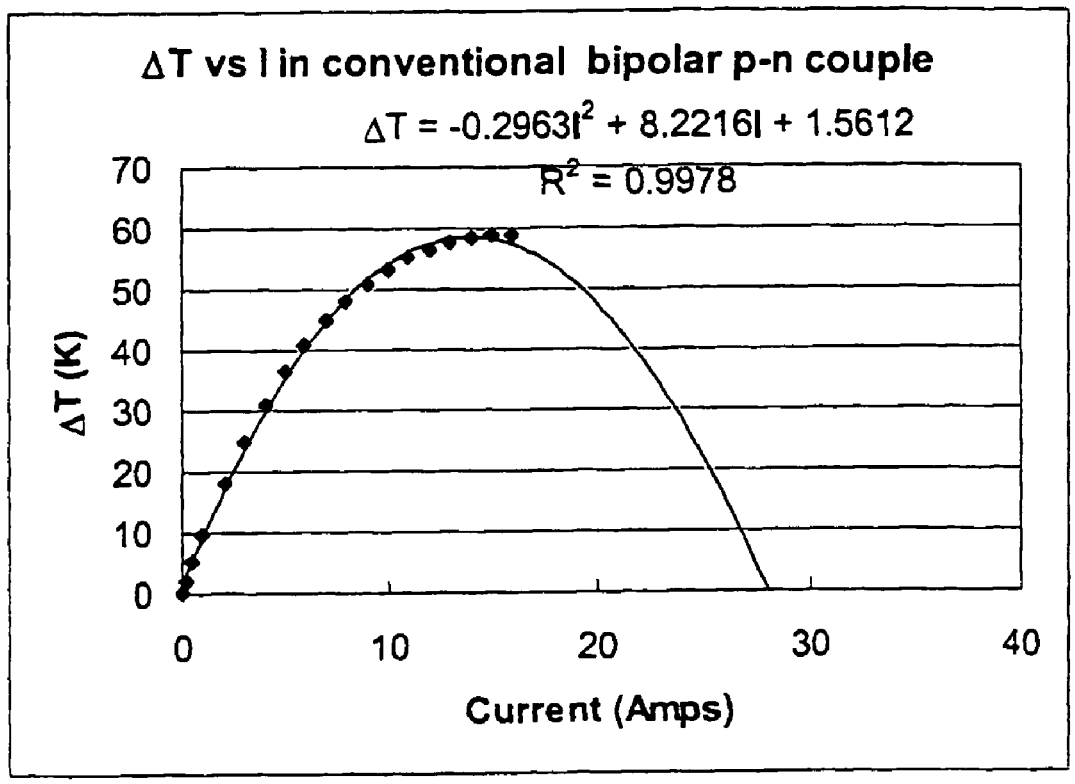
FIG. 3A is a graph showing a ΔT, temperature difference, between a heat-sink and a heat-source versus current flow in conventional bipolar couple.
FIG. 3B is a table showing a ΔT, temperature difference, between a heat-sink and a heat-source versus current flow in conventional bipolar couple.

For example, a conventional bipolar bulk p-n couple shows ΔTmax of 58.8K, typical of most standard bulk $Bi_2Te_3$-based TE technology. This data is shown in FIGS. 3A and 3B. FIGS. 3A and 3B are a graph and table showing a ΔT, temperature difference, between a heat-sink and a heat-source versus current flow in a conventional bipolar couple. The data shown in FIG. 3A was taken from p-n couples with aspect ratios (ratio of height of element to area of element, in units of cm⁻) of approximately 3 cm$^{-1}$. Thus, the peak $\Delta T_{max}$ shown in FIG. 3 occurs around 15 Amps, as expected.

Figures 4A, 4B:
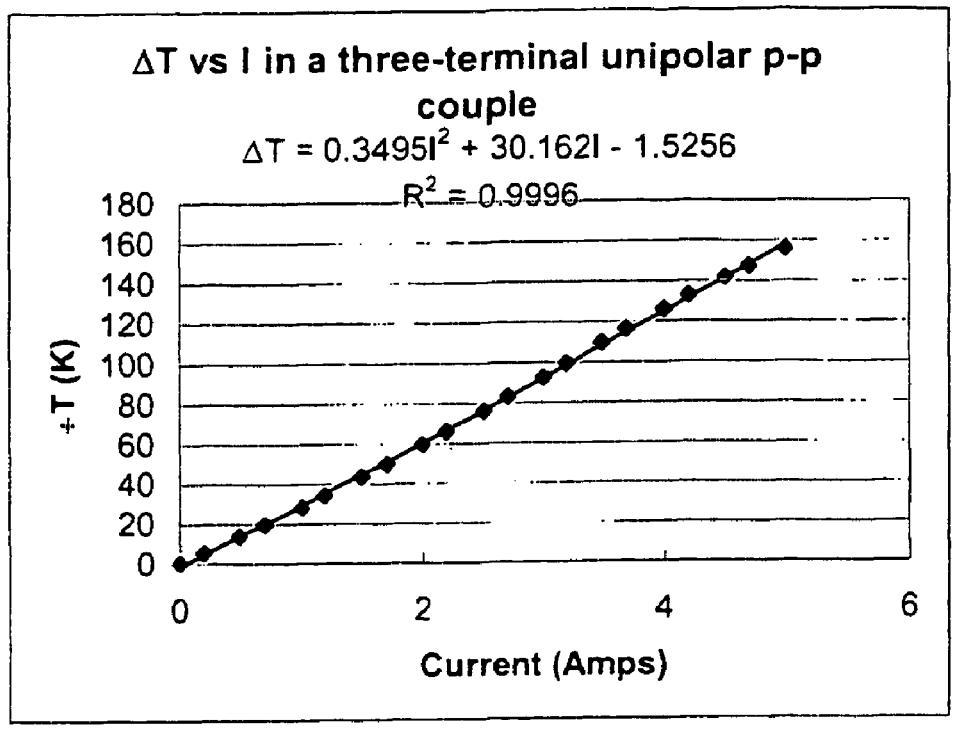
FIG. 4A is a graph showing a ΔT, temperature difference, between a heat-sink and a heat-source versus current flow in a three-thermal-terminal p-p couple of the present invention.
FIG. 4B is a table showing a ΔT, temperature difference, between a heat-sink and a heat-source versus current flow in a three-thermal-terminal p-p couple of the present invention.

By contrast, FIGS. 4A and 4B are a graph and table showing a ΔT, temperature difference, between a heat-sink and a heat-source versus current flow in a three-thermal-terminal p-p couple having similar aspect ratio elements to the conventional bipolar couple measured in FIGS. 3A and 3B. FIG. 4A illustrates that the trans-thermoelectric devices of the present invention can achieve a $\Delta T_{max}$ of ~155.7K across a three-terminal unipolar, p-p, bulk couple. In the present invention, a ratio of ΔTmax/cycle of current flow between heat-source and drain is a figure of merit. The cold side (source) was at minus 6.2° C., and the hot-side (drain) was at plus 149.5° C. in this demonstration. The heat sink or gate was kept at ~23° C. The data in FIGS. 4A and 4B also shows a more linear response, due to the maintenance of the heat sink or gate at −23° C., even with no forced heat-removal at the drain. If the drain had been kept thermally managed to ~100° C., using for example an air-fin arrangement, the cold-side (source) would be even cooler than that shown in FIG. 4A. The table in FIG. 4B depicts the highest $\Delta T_{max}$ observed for bulk p-type $Bi_{2-x}Sb_xTe_3$ alloy thermoelements, with the I vs. ΔT being shown in bold for comparison for a given value of current flow between the source and drain. The results in FIGS. 4A and 4B employ p-type unipolar couples of $Bi_{0.4}Sb_{1.6}Te_3$, approximately 1 mm thickness, and having a doping level about 3×19 cm$^{-3}$. In the present invention, a ratio of $\Delta T_{max}$/cycle of current flow between heat-source and drain is a figure of merit.

FIGS. 3A and 4A show that the present invention has been able to achieve a $\Delta T_{max}$ of ~155.7K across a three-terminal unipolar, p-p, bulk couple. The cold side was at minus 6.2° C. and hot-side was at plus 149.5° C. This result was achieved with no forced heat removal from the hot-end of the p-p, unipolar, transthermistor device. In contrast, the conventional bipolar bulk p-n couple in FIG. 3A shows $\Delta T_{max}$ of 58.8K, typical of most standard bulk $Bi_2Te_3$-based TE technology.

The unipolar devices of the present invention have other advantages besides coefficient of performance (COP). The hot-side of the p-p or n-n unipolar couple can now be operated at a much higher temperature, thereby making heat-removal for a given ambient temperature easier. For example, in a conventional bipolar p-n couple, a current of 2 Amps leads to a cold-side of 3.9° C. (from a no-current value of 22.1° C.), with hot-side of 22° C., and thus a ΔT of 18.1° C. In contrast, in a unipolar p-p couple, a 2 Amp current leads to a cold-side of 2.5° C. (from a no-current value of 22.4° C.) and a hot-side of 61.9° C., and thus a ΔT of 59.4° C., providing more than a factor of three increase in the temperature differential of the unipolar p-p couple as compared to the conventional bipolar p-n couple for the same drive current. Accordingly, in the present invention, the unipolar couple elements can produce temperature differentials (depending on the magnitude of current flow) in a range from 1K to 200K.

Furthermore, consider for example an ambient temperature of 18° C. For an ambient of 18° C., it is easier to dissipate heat from a hot-side of 59.4° C. of the unipolar p-p couple than from a hot-side of 22° C. in a conventional bipolar-n couple. The larger temperature difference between the heat-drain and the ambient will permit the use of for example smaller and/or quieter cooling fans. In addition, the ability to raise the drain temperatures such as 149.5° C. permits the present invention to utilize phase-change heat-transfer solutions, using a high-heat-transfer coefficient liquid like water, while still being able to achieve −6° C., sufficient for cooling a cold-finger for refrigeration or air-conditioning purposes.

The trans-thermoelectric devices of the present invention are expected to be useful in monolithic electronic/optoelectronic chip technology cooling where heat is taken from certain heat-sensitive spots and deposited at different, non-heat-sensitive spots on the chip, and is expected to be useful in cooling infrared devices including infrared countermeasure devices and infrared simulation devices.

According to the present invention, the use of only p-p or n-n unipolar couples in a module format (e.g., the use of multiple sets of p-p or n-n couples) can be implemented with reduced thermal transfer losses, through any electrical interconnection between the drain and source by metallic wires, by making sure that the electrical connections are made suitably after a thermal equilibration to ambient temperatures. For example, the electrical lead from the drain can be taken through a point of thermal equilibrium temperature, corresponding to the equilibration between the heat sink (where heat is to released) and the thermoelectric device point labeled as drain, and then sent through a point of thermal equilibrium temperature, corresponding to the equilibration between the heat source (where heat is to be absorbed) and the thermoelectric device point labeled as source. Such issues are not present if two or more p-p couples are operated electrically in parallel (and thermally parallel as well) or similarly if two or more n-n couples are operated electrically in parallel (and thermally in parallel as well).

The p-p unipolar couple of the present invention can be used in conjunction with an n-n unipolar couple for ease of integration into a modular device. As such, it is possible that the heat-sink temperatures for the respective unipolar couple elements can be different. Under this situation, the present invention would have four temperature terminals (a heat source, a heat drain, a heat-sink/gate of n-type, and a heat-sink/gate of p-type) and two electrical terminals.

Figure 5:
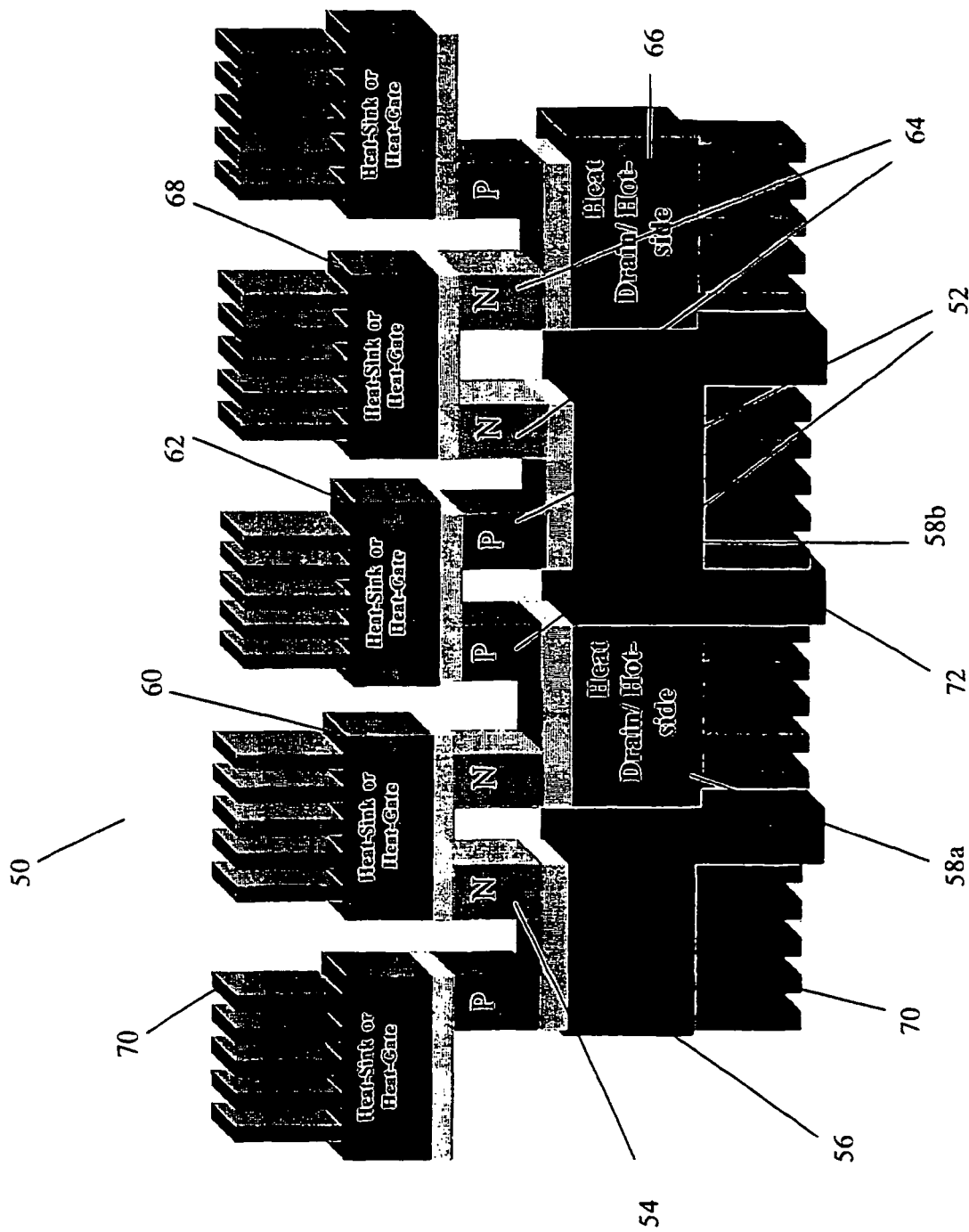
FIG. 5 is a schematic illustration according to another embodiment of the present invention of an integrated p-p couple and n-n couple thermoelectric module.

FIG. 5 is a schematic illustration of an integrated p-p couple and n-n couple thermoelectric module 50. A module constructed with a set of p-p couples 52 or n-n unipolar couples 54 and 64 is shown in FIG. 5. The first unipolar, n-n couple 54 shown on the left has three temperature zones—heat source 56, heat member 58, and heat sink/gate 60. The first unipolar, p-p couple 52 shown to the right of the first unipolar, n-n couple 54 has three temperature zones—heat member 58a, heat member 58b, and heat sink/gate 62. The second unipolar, n-n couple 64 shown to the right of the first unipolar, p-p couple 52 has three temperature zones—heat member 58b, heat drain 66, and heat sink/gate 68. Fins 70, although optional, are shown at each of these temperature zones. The fins 70 can be replaced with high thermal conductivity heat spreaders. Thermal insulation 72, as noted above, can be used depending on the dissimilarity of performance between the n- and p-materials. Thus, the heat-sink temperature joining two adjacent n-legs can be different from the heat-sink temperature joining two adjacent p-legs.

As such, the present invention can utilize multiple temperature stages. For example, a temperature zone corresponding to for example heat sink/gates 60, 62, and 68 in FIG. 5 need not be physically continuous. Rather, in one embodiment of the present invention, each block of a particular temperature zone, is attached to a respective common block, which essentially will represent a tiled or split stage. This is advantageous for reducing thermal stress issues as the various temperature zones can be managed with better accommodation for thermal expansion relief.

The present invention can utilize a counterflow of heat-transfer fluids at the source and drain sides to facilitate optimal heat-transfer processes. That is the flow of heat-transfer fluids through the various drain contacts is in a direction opposite to that through the respective source contacts, minimizing the $\Delta T$ across each of the device couple. As seen from the data in FIG. 4, a reduced $\Delta T$ implies less current and hence less power. Thus, for the same external $\Delta T$ needed at a system level which implies certain temperatures of inlet and outlet heat-transfer fluids, the present invention can operate the individual thermoelectric p-p couple or n-n couple at lower temperatures. Hence, in the present invention, a temperature of an intermediate stage can be controlled by fluids that exit from a hot-stage. Consequently, these fluids would have dropped in temperature, and perhaps can be mixed with a lower-temperature fluid.

The concepts illustrated by the present invention can be used with bulk thermoelectric (ZT~1 at 300K) technology to potentially achieve a coefficient of performance (COP), for a given $\Delta T$, of a factor of two or better than the conventional p-n couple-based modules. Similarly, utilizing superlattice thermoelectric (ZT~2.4 at 300K) technology in conjunction with the present invention is expected to achieve COP approaching that of freon-based mechanical systems. The approach of the present invention permits a factor of two better material utilization in the fabrication of thin-film thermoelectric modules. The present invention can be enhanced further with superlattice p-type thermolements and/or n-type superlattice thermoelements. The present invention is not limited to any particular type of material. Rather, the present invention is applicable to any bulk or thin-film thermoelectric material regardless of operating temperatures.

The present invention has applicability to numerous thermoelectric device applications, including cooling/heating, and those applications discussed in U.S. application Ser. No. 10/118,236, entitled "THIN FILM THERMOELECTRIC COOLING AND HEATING DEVICES FOR DNA GENOMIC AND PROTENIC CHIPS, THERMO-OPTICAL SWITCHING CIRCUITS, AND IR TAGS", the entire contents of which are incorporated herein by reference and power conversion, where local selective heating and cooling on surfaces is utilized to engineer DNA genomic and protein chips, to produce thermooptical switching circuits, and to produce infrared tags. In such applications, thermoelectric cooling and heating devices are provided with a substrate and a plurality of thermoelectric elements arranged on one side of the substrate to perform at least one of selective heating and cooling. Each thermoelectric element includes a thermoelectric material, a Peltier contact contacting the thermoelectric material and forming under electrical current flow at least one of a heated junction and a cooled junction, and electrodes configured to provide current through the thermoelectric material and the Peltier contact. As such, the thermoelectric cooling and heating devices selectively bias each individual thermoelectric element on the device to provide on one side of the thermoelectric device a grid of localized heated or cooled junctions. In such application, the unipolar couple elements of the present invention can be used as the above-noted thermoelectric element.

The present invention can utilize the phonon-blocking electron structures described in U.S. Ser. No. 10/265,409 entitled "PHONON-BLOCKING, ELECTRON-TRANSMITTING LOW-DIMENSIONAL STRUCTURES", the entire contents of which are incorporated by reference, to enhance the materials performance of the thermoelectric materials in the legs of the unipolar couple element of the present invention. In phonon-blocking structures, thermoelectric structures include at least first and second material systems having different lattice constants and interposed in contact with each other, and a physical interface at which the at least first and second material systems are joined with a lattice mismatch and at which structural integrity of the first and second material systems is substantially maintained. The first and second material systems have a charge carrier transport direction normal to the physical interface and preferably periodically arranged in a superlattice structure. The first and second material systems in contact with each other have a lattice mismatch in a plane perpendicular and/or in a plane parallel to a central axis common to both materials systems. A periodicity of the at least first and second material systems is configured to reduce thermal conduction in a direction along the periodicity. The perpendicular plane is substantially normal to an electrical carrier transport direction in the device, and the lattice mismatch provides an acoustic mismatch to reduce the thermal conduction along the electrical carrier transport direction.

The present invention has applicability to the cascade thermoelectric device applications described in U.S. Ser. No. 09/812,811 entitled "CASCADE CRYOGENIC THERMOELECTRIC COOLER FOR CRYOGENIC AND ROOM TEMPERATURE APPLICATIONS", the entire contents of which are incorporated by reference, where cascades of thermoelectric devices are utilized to produce cascade coolers with a range of operational temperatures from cryogenic to room temperature applications. In such application, a cascade thermoelectric cooler integrates high performance\high-ZT $Bi_xSb_{2-x}Te_3$ and $Bi_2Te_{3-x}Se_x$-based super-lattice-structure thin-film thermoelectric devices with a bulk-material based thermoelectric cooler including plural cascaded cold stages with each successive cascaded cold stage able to cool to a progressively lower temperature. Each cold stage in the bulk-material thermoelectric cooler includes a heat source plate, a heat sink plate, p-type thermoelectric elements, and n-type thermoelectric elements. Moreover, the thin film thermoelectric cooler can have multiple stages which each stage contains a heat source plate, a heat sink plate, p-type super-latticed thermoelectric elements, and n type super-latticed thermoelectric elements. By attaching an output heat source plate on the thin-film thermoelectric cooler to an input heat sink plate on the bulk-material thermoelectric cooler, the integration of the thin film thermoelectric with the bulk-material-based thermoelectric yields a cascade thermoelectric cooler wherein the bulk-material-based thermoelectric cooler cools to 170-200 K and the thin-film thermoelectric device cools to cryogenic temperatures between 70 and 120 K. Another level of thin-film super-lattice integration can achieve temperatures near 50 K. The cascaded devices as such can employ the unipolar couple elements of the present invention rather than the conventional p-n thermoelectric pair.

Accordingly, in one embodiment of the present invention, there is provided a method for cooling an object. The method conducts heat from an object coupled to the trans-thermoelectric device of the present invention, flows currents in opposite directions (i.e. opposite current flow) in the two legs of the thermoelectric device to transport the heat across each of the legs in a direction away from the object, and disposes of the heat from the thermoelectric device into an ambient environment. Further, as noted above, a temperature of an intermediate-temperature stage connected between the two legs can be controlled to accordingly control the performance of the thermoelectric device. The opposite current flow can be established by applying opposite voltage potentials (i.e. by a voltage applicator) to respective of two electrical contacts at ends of the two legs. The opposite current flow establishes a temperature differential across the two legs to thereby cool the object.

Complementarily, there is provided by the present invention a method for thermoelectric power conversion. The method extracts heat from a heat source coupled to the above-noted trans-thermoelectric device, maintains a temperature differential across the thermoelectric device to a heat sink, and dissipates heat from the heat sink into an ambient environment. Maintaining the temperature differential across the two legs produces electrical power (i.e. at least one of an electrical potential and an electrical current) from thermoelectric device. Further, the method can control a temperature of an intermediate-temperature stage connected between the legs to produce electrical power for example by controlling a temperature of an intermediate stage by introducing a fluid exiting from a hot-stage coupled to the heat source onto the intermediate stage. The fluid temperature can for example be controlled by mixing the fluid exiting from the hot-stage with a lower-temperature fluid.

Accordingly, in a further embodiment of the present invention, there is provided a thermoelectric device having a heat source, a mechanism coupled to the heat source to generate current flows in opposite directions in the two legs of a thermoelectric material of a same conductivity type, and a heat sink coupled to the mechanism to dispose of heat from the thermoelectric device. The thermoelectric device can include an intermediate-temperature stage connected between the two legs, and a mechanism to control a temperature of the intermediate-temperature stage. One example of a mechanism coupled to the heat source to provide current flows in opposite directions (i.e. opposite current flow) includes a metal contact interposed between and connecting to the two legs, two electrical contacts connected to respective ends of the two legs opposite said metal contact upon which an opposite voltage potential is applied to respective of the electrical contacts. In this example, the opposite current flow through the two legs establishes a temperature differential across the two legs. In another example, a temperature differential across the two legs generates the opposite current flow.

Numerous modifications and variations of the present invention are possible in light of the above teachings. It is therefore to be understood that within the scope of the appended claims, the invention may be practiced otherwise than as specifically described herein.

The invention claimed is:

1. A thermoelectric device comprising:
   at least one unipolar couple element having first and second legs of a same electrical conductivity type;
   a first-temperature stage connected to the first leg wherein the first temperature stage is configured to function as one of a heat-source or a heat drain;
   a second-temperature stage connected across the first and second legs of the at least one unipolar couple element; and
   a third-temperature stage connected to the second leg, wherein the first leg is between the first-temperature stage and the second-temperature stage, and wherein the second leg is between the second-temperature stage and the third temperature stage, wherein the third temperature stage is configured to function as the other of the heat-source or the heat-drain.

2. A thermoelectric device comprising:
   at least one unipolar couple element having first and second legs of a same electrical conductivity type;

a first-temperature stage connected to the first leg;
a second-temperature stage connected across the first and second legs of the at least one unipolar couple element; and
a third-temperature stage connected to the second leg, wherein the first leg is between the first-temperature stage and the second-temperature stage, and wherein the second leg is between the second-temperature stage and the third temperature stage,
wherein said at least one unipolar couple element is configured such that currents flow in opposite directions in the first and second legs of the same electrical conductivity type of the at least one unipolar couple element to establish a temperature differential across each of the first and second legs of said unipolar couple element.

3. The device of claim 1, wherein said at least one unipolar couple element is configured to generate at least one of an electrical potential and an electrical current from a temperature differential established across the first and second legs of said unipolar couple element.

4. The device of claim 1, wherein the first and second legs of the at least one unipolar couple element comprise respective first and second p-type $Bi_2Te_3/Sb_2Te_3$ superlattice thermoelements.

5. The device of claim 4, wherein the first and second p-type $Bi_2Te_3/Sb_2Te_3$ superlattice thermoelements have a ZT of >1 at 300K.

6. The device of claim 1, wherein the first and second legs of the at least one unipolar couple element comprise respective first and second n-type $Bi_2Te_3/Bi_2Te_{3-x}Se_x$ superlattice thermoelements.

7. The device of claim 1, wherein the first and second legs of the at least one unipolar couple element comprise respective first and second n-type PbTeSe/PbTe superlattice thermoelements.

8. The device of claim 7, wherein the n-type $Bi_2Te_3/Bi_2Te_{3-x}Se_x$ superlattice thermoelements have a ZT>1 at 300K.

9. The device of claim 8, wherein the first and second n-type PbTeSe/PbTe elements comprise respective first and second n-type PbTeSe/PbTe quantum-dot superlattice thermoelements having a ZT of ~1.6 at 300K.

10. The device of claim 1, wherein the first and second legs of the at least one unipolar couple element comprise respective first and second p-type PbTeSe/PbTe superlattice thermoelements.

11. The device of claim 1, wherein the at least one unipolar couple element comprises a first unipolar couple element having the first and second legs comprising respective first and second p-type thermoelements, and wherein the at least one unipolar couple element comprises a second unipolar couple element having first and second n-type thermoelements.

12. The device of claim 1, wherein the first and second legs of the at least one unipolar couple element comprise respective first and second p-type thermoelements, and wherein the at least one unipolar couple element further comprises-two independent legs of n.

13. The device of claim 1, wherein the first and second legs of the at least one unipolar couple element comprise respective first and second n-type thermoelements, and wherein the at least one unipolar couple element further comprises two independent legs of p.

14. The device of claim 1, wherein the first and second legs of the unipolar couple elements comprise respective first and second p-type bulk thermoelements.

15. The device of claim 1, wherein the first and second legs of the unipolar couple elements comprise respective first and second n-type bulk thermoelements.

16. The device of claim 1, wherein the at least one unipolar couple element is configured to produce temperature differentials in a range from 1K to 200K.

17. The device of claim 1, further comprising:
a thermal insulation between said first-temperature stage and said third-temperature stage wherein the first and second legs of the same electrical conductivity type and the first-temperature stage and the third-temperature stage are on a same side of the second-temperature stage.

18. The device of claim 17, wherein the thermal insulation comprises at least one of aerogels and polymer sheets.

19. The device of claim 1, further comprising:
a controller configured to control a temperature of the second-temperature stage to produce desired source and drain temperatures on the first-temperature stage and the third-temperature stage, respectively.

20. The device of claim 19, wherein said controller is configured to control said current flow to produce said desired source and drain temperatures.

21. The device of claim 2, wherein said temperature differential across each of the first and second legs is about half a temperature differential between the first-temperature stage and the second-temperature stage.

22. The device of claim 1, wherein at least one of the first-temperature stage and the second-temperature stage comprises a split stage.

23. The device of claim 1, wherein said third-temperature stage is configured to operate at a temperature about 100 C so that a phase change of water to steam provides heat removal and said first-temperature stage is configured to operate at a temperature below 40 C.

24. The device of claim 1, wherein said third-temperature stage is configured to operate at a temperature about 100 C so that a phase change of water to steam provides heat removal and said first-temperature stage is configured to operate at a temperature below 10 C or below.

25. The device of claim 1, further comprising:
a water-based closed cycle heat removal system connected to the third-temperature stage.

26. The device of claim 1, wherein the first and second legs of the at least one unipolar couple element comprise respective first and second p-type thermoelements with the first and second p-type thermoelements having at least one of different material compositions and different structures.

27. The device of claim 26, wherein the first and second p-type thermoelements respectively comprise a p-type $Bi_{1.0}Sb_{1.0}Te_3$ thermoelement and a p-type $Bi_{0.5}Sb_{1.5}Te_3$ thermoelement.

28. The device of claim 26, wherein the p-p couple comprises: first and second p-type thermoelements respectively comprise a p-type 10 Angstrom/30 Angstrom $Bi_2Te_3/Sb_2Te_3$ superlattice thermoelement and a p-type 10 Angstrom/50 Angstrom $Bi_2Te_3/Sb_2Te_3$ superlattice thermoelement.

29. The device of claim 1, wherein the first and second legs of the at least one unipolar couple element comprises: comprises respective first and second n-type thermoelements with the first and second n-type thermoelements having at least one of different material compositions and different structures.

30. The device of claim 29, wherein the first and second n-type thermoelements respectively comprise an n-type $Bi_2Te_{2.5}Se_{0.5}$ thermoelement and an n-type $Bi_2Te_{2.85}Se_{0.15}$ thermoelement.

31. The device of claim 29, wherein the first and second n-type thermoelements respectively comprise an n-type 10

Angstrom/30 Angstrom $Bi_2Te_3/Bi_2Te_{2.85}Se_{0.15}$ superlattice thermoelement and an n-type 10 Angstrom/50 Angstrom $Bi_2Te_3/Bi_2Te_{2.85}Se_{0.15}$ superlattice thermoelement.

32. A thermoelectric device comprising:
at least one unipolar couple element having first and second legs of a same electrical conductivity type;
a first-temperature stage connected to the first leg;
a second-temperature stage connected across the first and second legs of the at least one unipolar couple element; and
a third-temperature stage connected to the second leg, wherein the first leg is between the first-temperature stage and the second-temperature stage, and wherein the second leg is between the second-temperature stage and the third temperature stage,
wherein the at least one unipolar couple element is configured such that currents flow in opposite directions in the first and second legs of the same electrical conductivity type of the at least one unipolar couple element.

33. The device of claim 32, wherein the first and second legs of the same electrical conductivity type and the first-temperature stage and the third-temperature stage are on a same side of the second-temperature stage, and wherein the first-temperature stage and the third temperature stage are spaced apart.

34. The device of claim 32, wherein the first and second legs of the same conductivity type comprise respective first and second materials wherein the first and second materials are different.

35. The device of claim 32 wherein the first and second legs of the same conductivity type have respective first and second structures wherein the first and second structures are different.

36. The device of claim 32 wherein the first and second legs of the same conductivity type comprise respective first and second superlattice thermoelements having respective first and second superlattice periods wherein the first and second superlattice periods are different.

37. The device of claim 32 wherein the first leg comprises a p-type $Bi_{1.0}Sb_{1.0}Te_3$ thermoelement, and wherein the second leg comprises a p-type $Bi_{0.5}Sb_{1.5}Te_3$ thermoelement.

38. The device of claim 32 wherein the first-temperature stage and the second-temperature stage are spaced apart, wherein the second-temperature stage and the third-temperature stage are spaced apart, and wherein the first-temperature stage and the third-temperature stage are spaced apart.

39. The device of claim 1, wherein said at least one unipolar couple element is configured such that currents flow in opposite directions in the first and second legs of the same electrical conductivity type of the at least one unipolar couple element to establish a temperature differential across each of the first and second legs of said unipolar couple element.

40. The device of claim 1, wherein the at least one unipolar couple element is configured such that currents flow in opposite directions in the first and second legs of the same electrical conductivity type of the at least one unipolar couple element.

* * * * *

UNITED STATES PATENT AND TRADEMARK OFFICE
CERTIFICATE OF CORRECTION

| | | |
|---|---|---|
| PATENT NO. | : 7,838,760 B2 | Page 1 of 1 |
| APPLICATION NO. | : 10/536463 | |
| DATED | : November 23, 2010 | |
| INVENTOR(S) | : Venkatasubramanian et al. | |

It is certified that error appears in the above-identified patent and that said Letters Patent is hereby corrected as shown below:

Column 6, Line 23: Please correct "at -23°" to read -- at ~23° --

Column 11, Claim 9, Line 39: Please correct "claim 8" to read -- claim 7 --

Signed and Sealed this
Thirty-first Day of May, 2011

David J. Kappos
*Director of the United States Patent and Trademark Office*